United States Patent
Brush et al.

(10) Patent No.: US 6,455,379 B2
(45) Date of Patent: Sep. 24, 2002

(54) POWER TRENCH TRANSISTOR DEVICE SOURCE REGION FORMATION USING SILICON SPACER

(75) Inventors: Linda S. Brush; Jun Zeng, both of Mountaintop, PA (US); John J. Hackenberg, West Melbourne, FL (US); Jack H. Linn, Melbourne, FL (US); George V. Rouse, Indialantic, FL (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/799,845

(22) Filed: Mar. 6, 2001

Related U.S. Application Data

(62) Division of application No. 09/525,182, filed on Mar. 14, 2000, now Pat. No. 6,246,090.

(51) Int. Cl.[7] .............................................. H01L 21/336
(52) U.S. Cl. ........................ 438/270; 438/212; 438/259; 438/268; 438/272
(58) Field of Search ................................ 438/212, 259, 438/270–272, 268, 589; 257/329–334, 618

(56) References Cited

U.S. PATENT DOCUMENTS 5,300,447 A * 4/1994 Anderson .................. 437/203
5,528,058 A    6/1996 Pike, Jr. et al.
5,644,148 A    7/1997 Kinzer
5,689,128 A   11/1997 Hshieh et al.
5,770,878 A    6/1998 Beasom
5,843,625 A   12/1998 Hause et al.
5,904,510 A    5/1999 Merrill

* cited by examiner

Primary Examiner—Tom Thomas
Assistant Examiner—Ori Nadav
(74) Attorney, Agent, or Firm—Thomas R. FitzGerald

(57) ABSTRACT

A power trench MOS-gated transistor is constructed with a buried gate to source dielectric inside a gate trench region. In the innovative device, a thick oxide (grown or deposited) is used to define the height of the trench walls. A body region is initially formed by selective epitaxial growth and etch back. Source regions are formed also by selective epitaxial growth. The body is finally formed by selective epitaxial growth and etch back. The oxide is removed from the trench, the trench walls are oxidized to form a gate oxide, and doped polysilicon fills the trench to form a gate. By the formation of the source region using the spacer etch, this process simplifies the fabrication of power trench gated devices, and provides for increased contact surface area without increasing device size.

12 Claims, 11 Drawing Sheets

POWER TRENCH TRANSISTOR DEVICE SOURCE REGION FORMATION USING SILICON SPACER

CROSS-REFERENCE TO RELATED APPLICATIONS

This application is a divisional application of U.S. patent application Ser. No. 09/525,182, filed Mar. 14, 2000, U.S. patent No. 6,246,090.

FIELD OF INVENTION

The present invention relates generally to semiconductor devices, and more specifically to a trench-gated semiconductor device having trench walls formed by selective epitaxial growth.

DEFINITIONS

The term "trench MOSFET device" is used in this specification to refer to a device with multiple sources separated by gated trenches and sharing a common drain.

DISCUSSION OF PRIOR ART

A typical prior-art trench MOSFET device is made up of an assembly of sources, each separated by gate regions constructed inside a trench with gate dielectric located on all its sides. The trench is filled with polysilicon used as a gate electrode. Source connection is achieved using thick top metal, through the gate-source dielectric opening, by direct contact with silicon source and body regions. The backside (bottom) of the N+substrate is used as a drain. A typical trench MOSFET device consists of an array of sources and gates arranged in various cellular or stripe layouts currently used by the industry. Such devices are typically made with a substrate and multiple deposition, ion implantation, masking and removal steps. It would be desirable to reduce the number of steps or simplify the overall process of fabrication.

SUMMARY

The formation of the N+source and P+body regions of trench MOSFET devices is usually accomplished by implantation and thermal activation and diffusion. It would be advantageous to eliminate the separate precise steps necessary for such formation processes, and accomplish the same or better results using selective epitaxial growth and etch back. A thick oxide is grown or deposited on an N-type epitaxial layer that is on top of a N-type silicon substrate to define the height and width of the intended trench. The body region is partially formed by selective epitaxial growth (SEG) and etch back. Source regions are then formed by SEG. The body is completed by SEG and etch back, followed by trench oxide removal. Without added fabrication steps, the etch back of the body region gives the device a recessed body, which offers opportunities both to improve device UIS (unclamped inductive switching) capability and to increase contact area to reduce contact resistance. A wet etch of the trench sidewalls avoids residual effects from plasma etching of the silicon, such as damage from high-energy plasma elements and unwanted etch-rate variation. Gate oxide is then grown or deposited in the gate trench. After gate oxidation, the P-type epitaxial layer will laterally and vertically diffuse around the trench corners, offering alleviation of trench-corner-related reliability problems. Gate material is then deposited to fill the trench. Excess oxide is removed from the surface. An interlevel dielectric material is deposited on top of all the diffusions and trench gate region. A contact etch then exposes all N+source and P+body planar contact area, while leaving dielectric intact inside the trench. As in prior-art devices, source/body contact metal is deposited on the top surface and drain contact metal is deposited on the backside of the wafer.

DETAILED DESCRIPTION OF INVENTION

Figure 1:
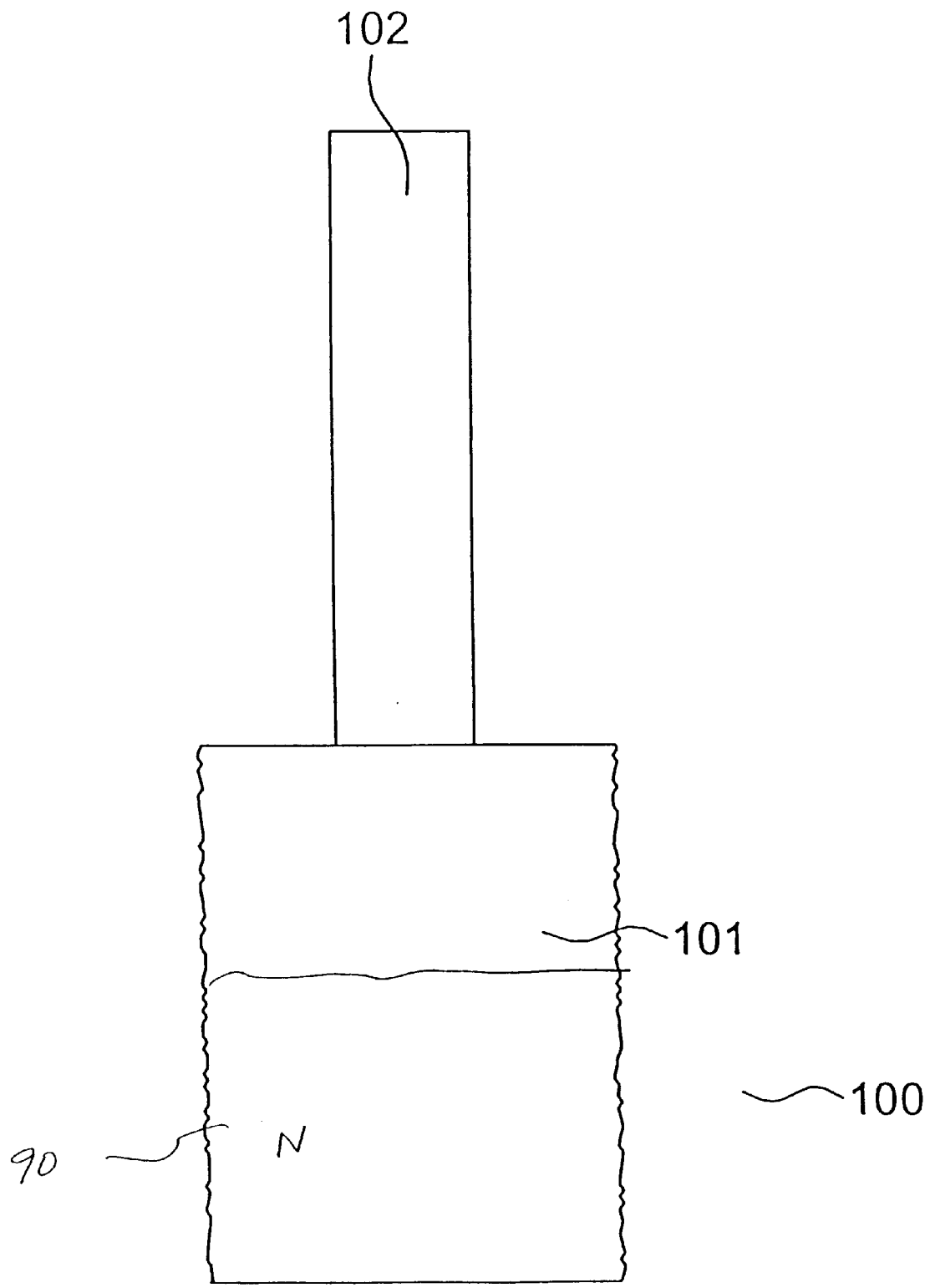
FIG. 1 shows the definition of the trench by growth or deposition of field oxide.
Figure 2:
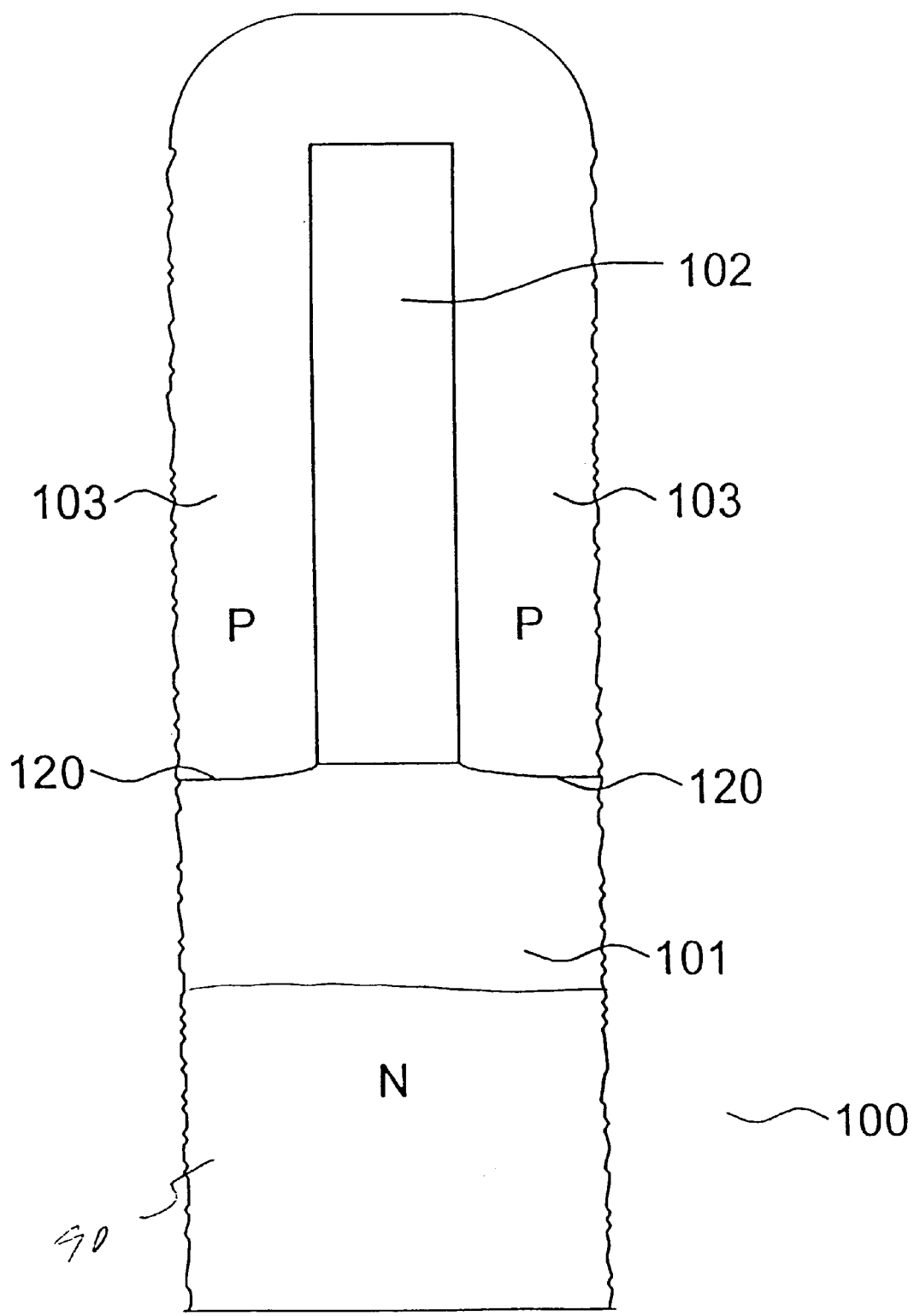
FIG. 2 shows the initial definition of the body region surrounding the trench by selective epitaxial growth of a P-type layer.
Figure 3:
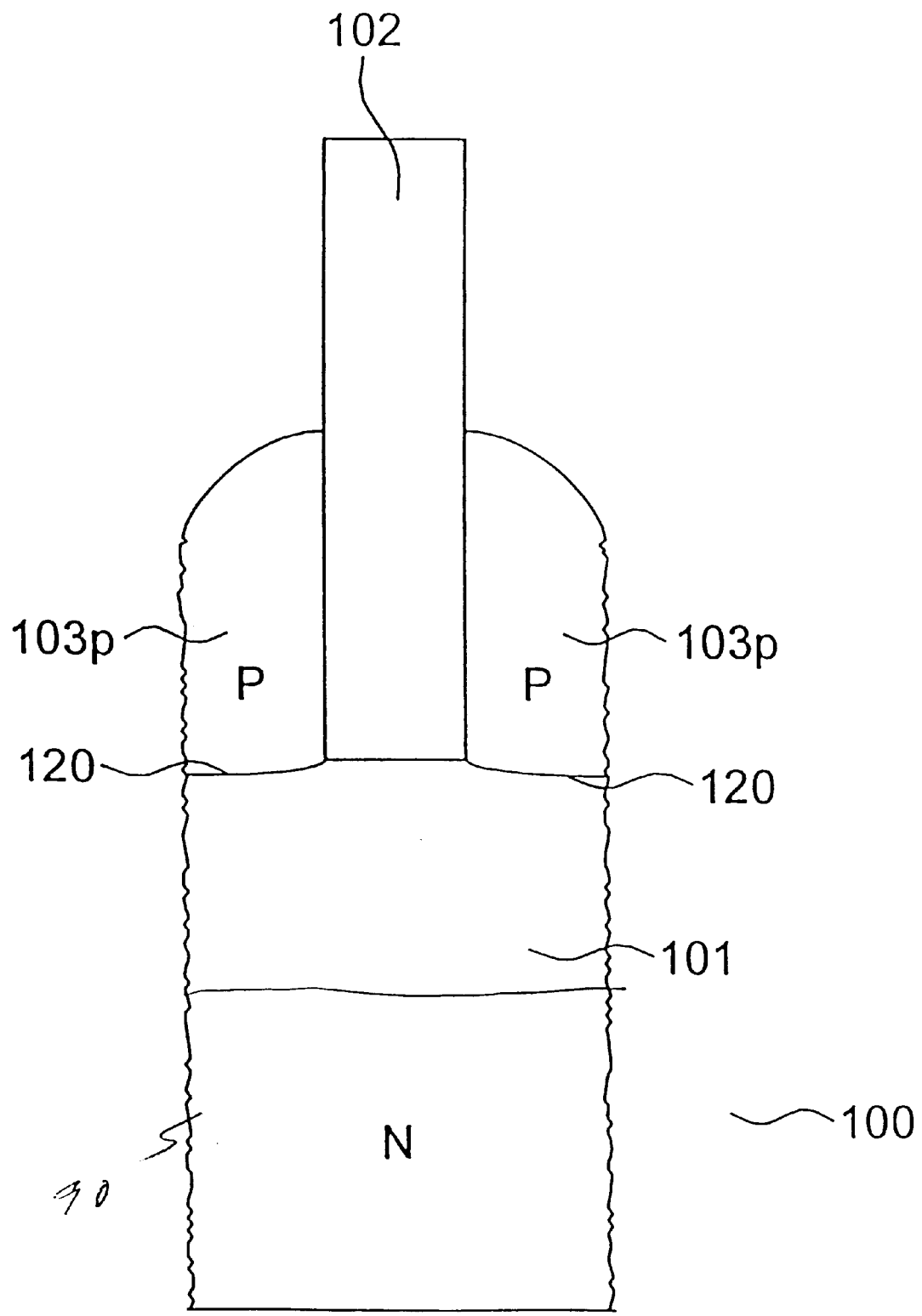
FIG. 3 shows the selective epitaxial growth and etch back of the defined body region.

The present invention incorporates advantages and processes developed and elucidated in U.S. patent application No. 09/318,334, titled Trench-gated Device Having Trench Walls Formed by Selective Epitaxial Growth And Process For Forming Device, herein incorporated by reference. Refer to FIG. 1. Fabrication begins with an N-type silicon substate 90 that is about 350 microns thick and has a resistivity of about 0.0035 ohm-cm. The top of the substrate 90 has an N-type epitaxial layer 101 whose thickness and resistivity is chosen to match the desired breakdown voltage. A typical epitaxial layer 101 could be 10 microns thick and have a resistivity of 1 ohm-cm. To construct device 100, a thick oxide 102 is grown or deposited and patterned on a epitaxial layer 101 of N-type silicon to define the height, width and shape of the intended gate trench. As shown in FIG. 2, a material 103, typically P-type, of device 100 is then added via selective epitaxial growth (SEG), creating a P-N boundary 120 with epitaxial layer 101. Material 103 is then planarized into a body region 103p, as in FIG. 3.

Figure 4A:
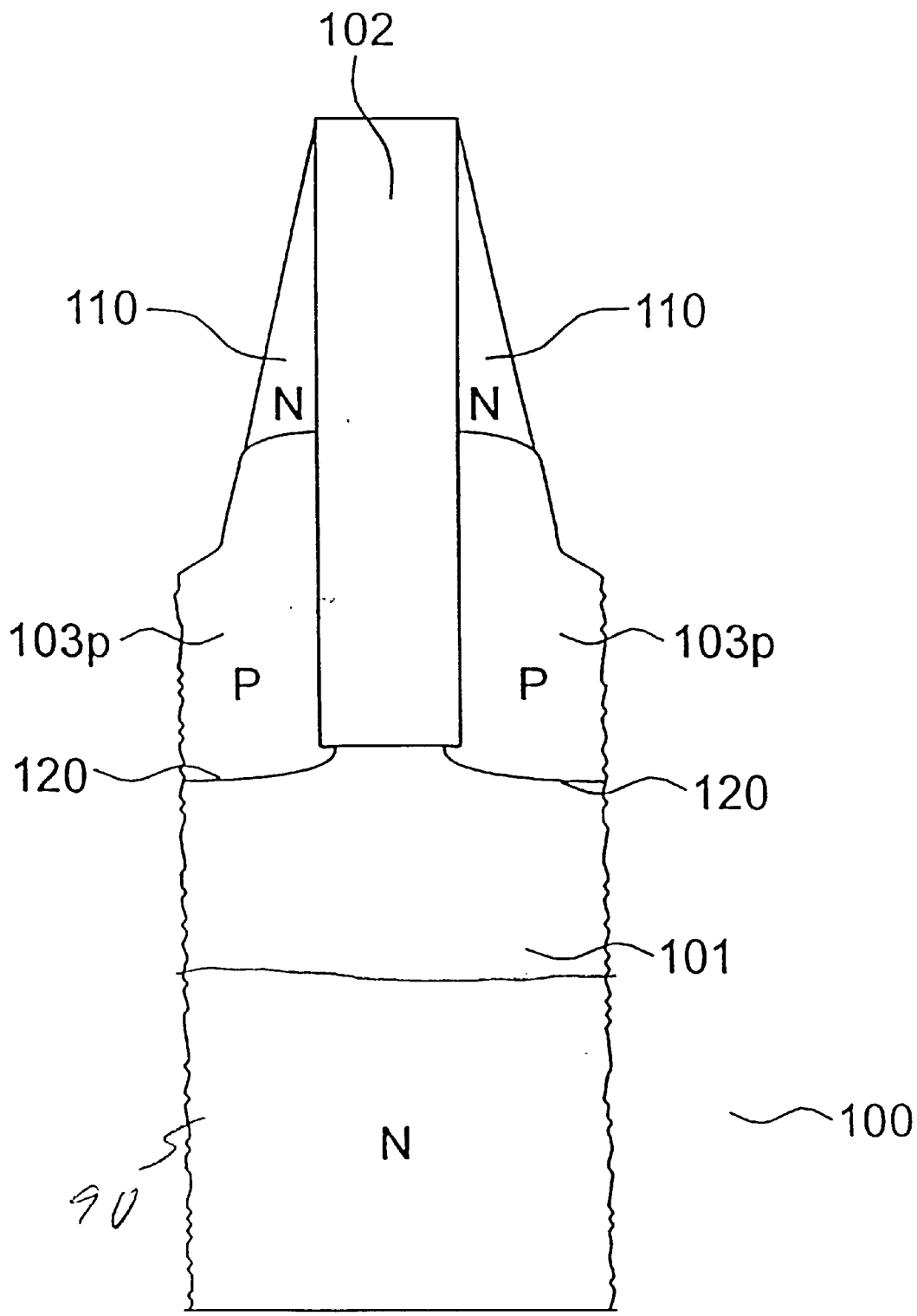
FIG. 4a shows the selective epitaxial growth of the source region after etch back to the top of the oxide.
Figure 4B:
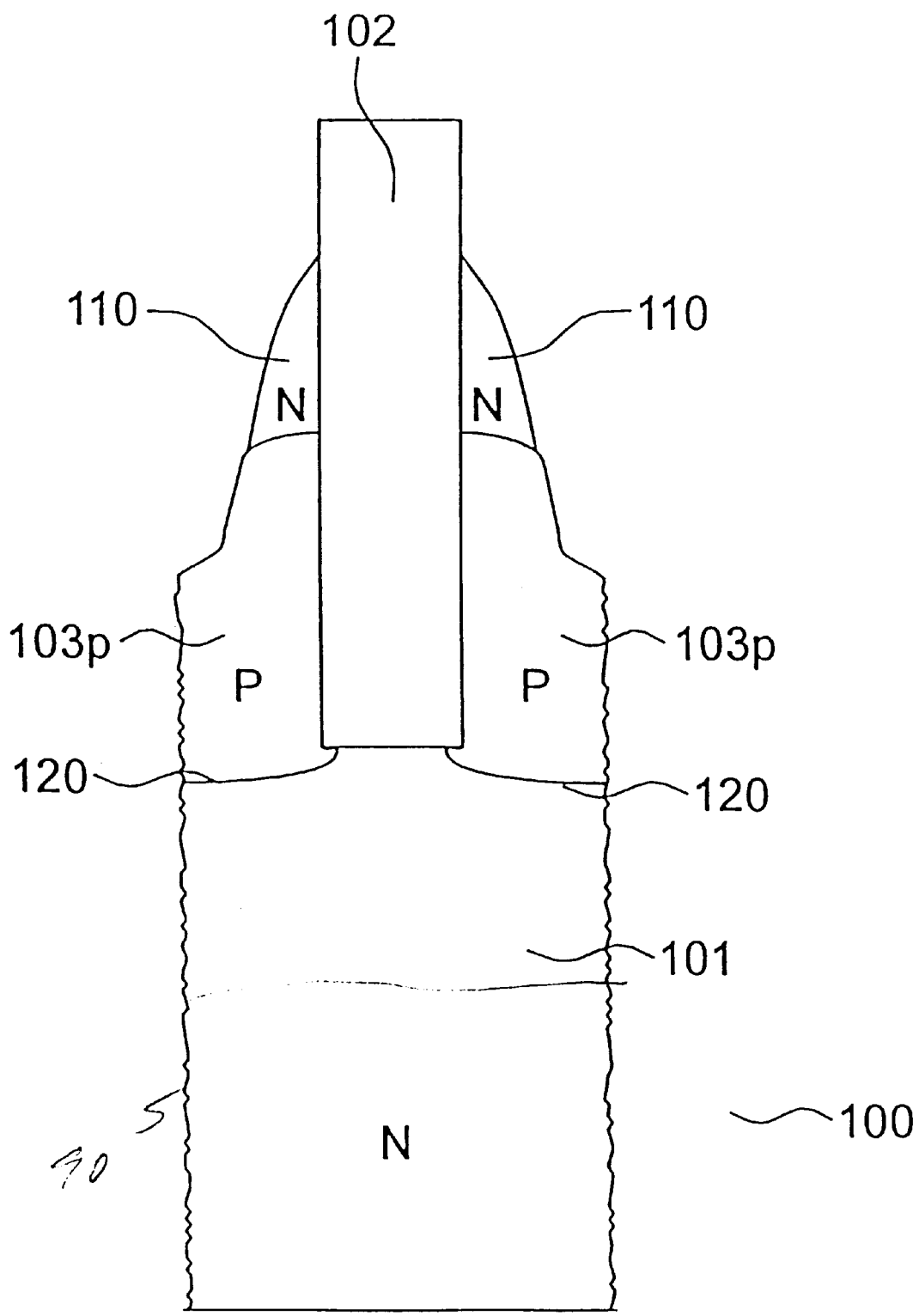
FIG. 4b shows the etch back and spacer etch of the source region.
Figure 4C:
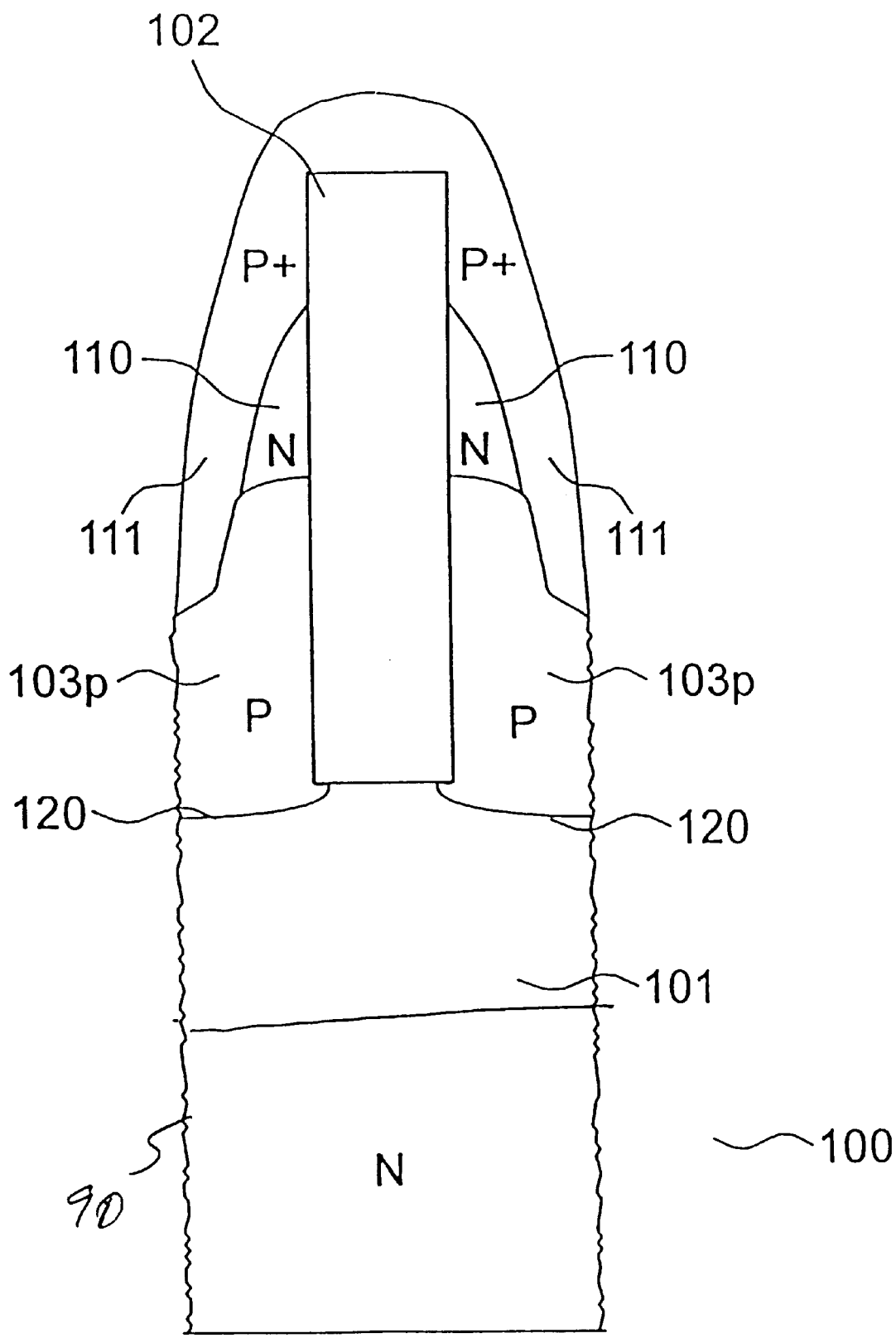
FIG. 4c shows the selective epitaxial growth of the device body region.
Figure 5:
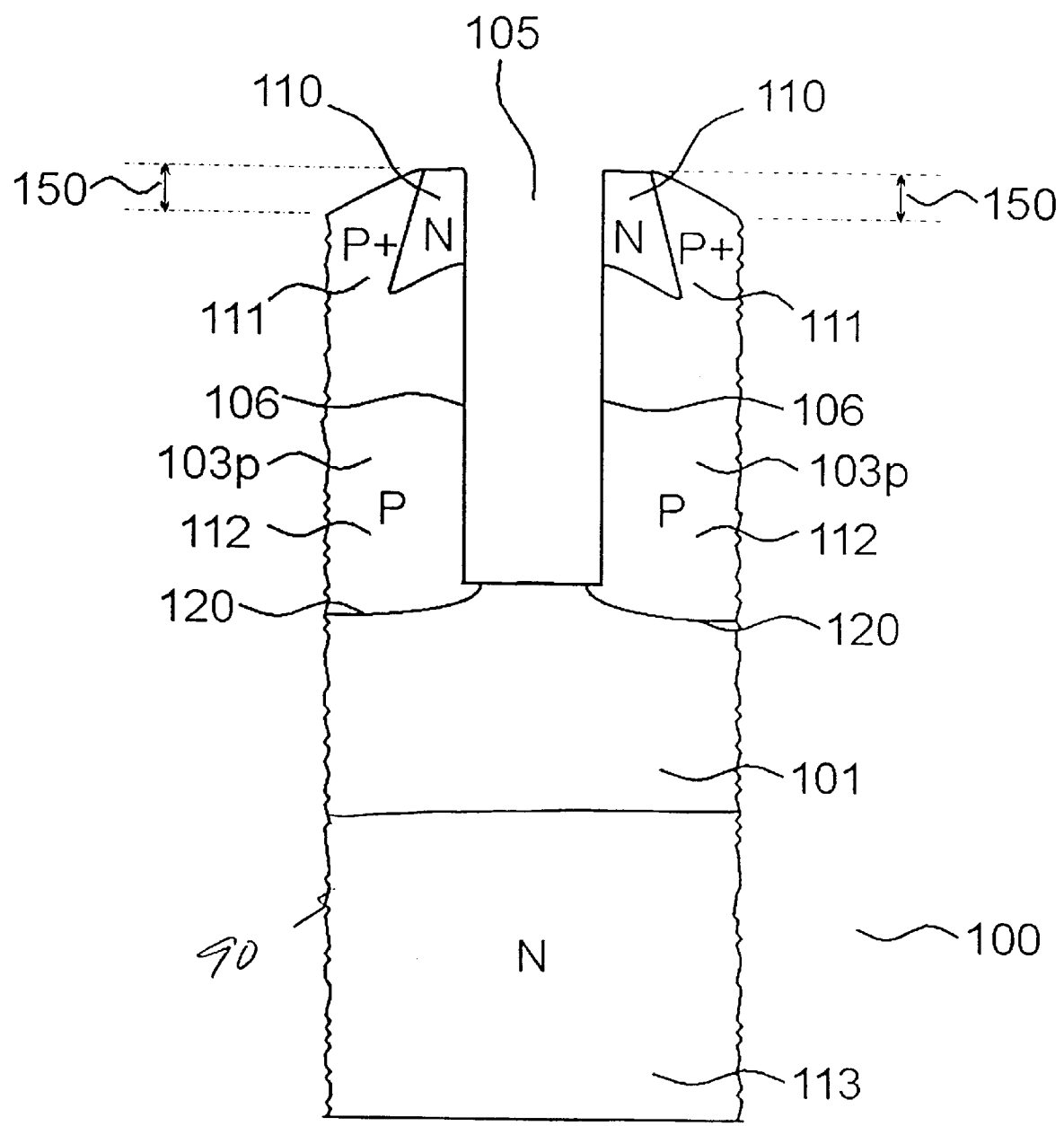
FIG. 5 shows the device body completion by etch back, with the degree of recess in the device body noted.

Referring to FIG. 4a, a source region 110, typically N-type, is formed also by SEG and etch back, followed by a silicon spacer etch. This series of steps shapes source region 110 as shown in FIG. 4b. A P+body region 111 is then grown by SEG on the source region 110 and the body region 103p, as shown in FIG. 4c. Refer now to FIG. 5. Following the formation of source region 110 and body region 111, the etch back of body region 111 and source 110 in a single step gives device 100 a body region 111 with an angled recess 150. Gate trench oxide 102 is then removed, leaving trench 105 ready for deposition of gate oxide 107 (see FIG. 6). The lowest portion of epitaxial layer 103p serves as a P-well region 112, and the lower portion of epitaxial layer 101 provides a drain region 113.

The invention eliminates conventional steps of implantation and diffusion for forming source and body regions in prior devices. Recess 150 of body region 111 has a larger surface area that facilitates improvement in unclamped inductive switching (UIS) capability for device 100. It increases contact area for body 111 and source region 110 to reduce contact resistance. Using planarization techniques well-known in the art, recess 150 may be varied in depth according to the degrees of need for reduction in contact resistance and for UIS capability improvement, consistent with all commonly-applied constraints on depth and breadth variation for power trench transistor devices.

Wet etch of sidewalls 106 of gate trench 105 avoids residual effects from plasma etching of the silicon, such as damage from high-energy plasma elements and unwanted etch-rate variation. A cleaning step before gate oxidation may be used to clean the silicon surface of gate trench 105.

Figure 6:
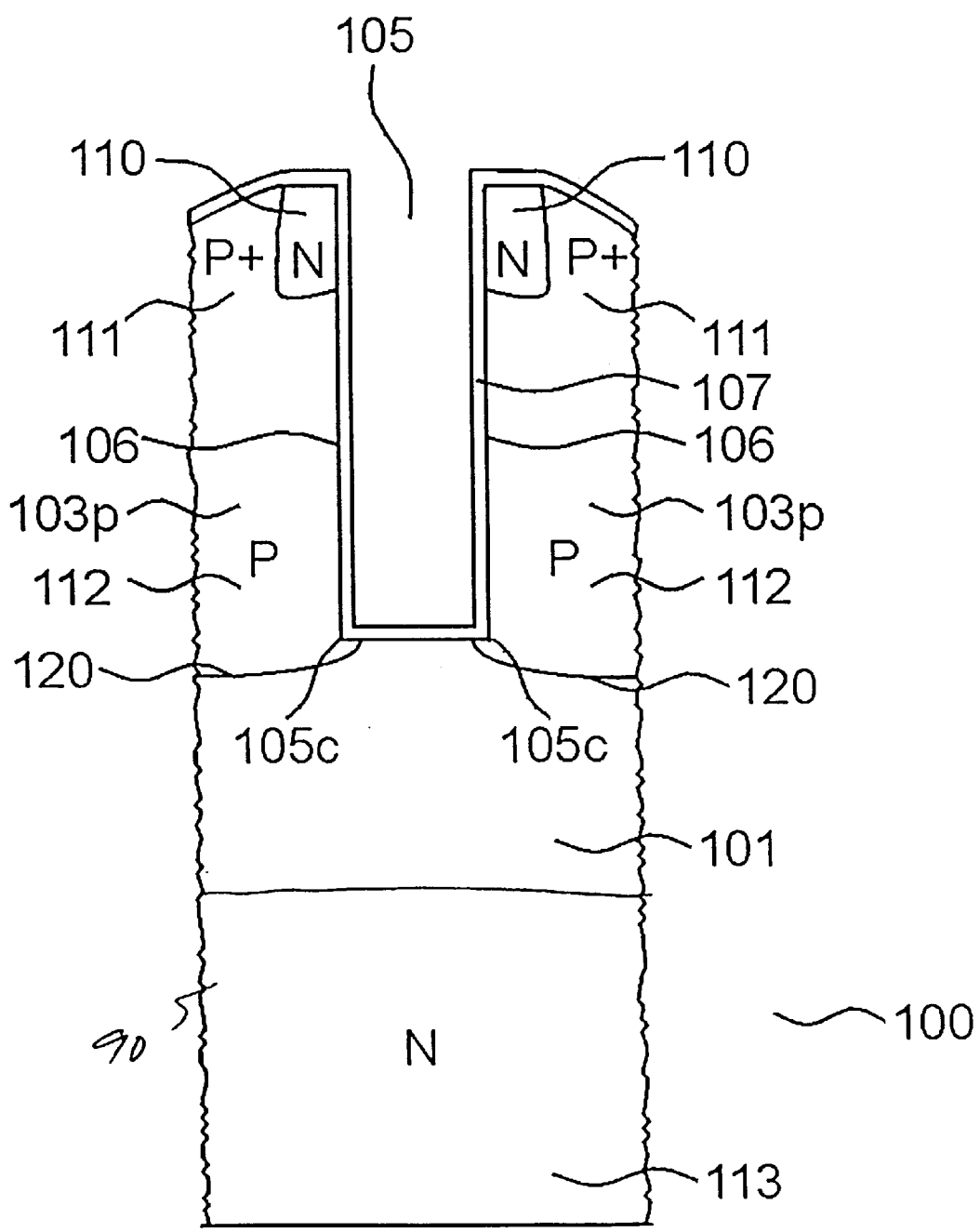
FIG. 6 shows the device after gate oxidation.
Figure 7:
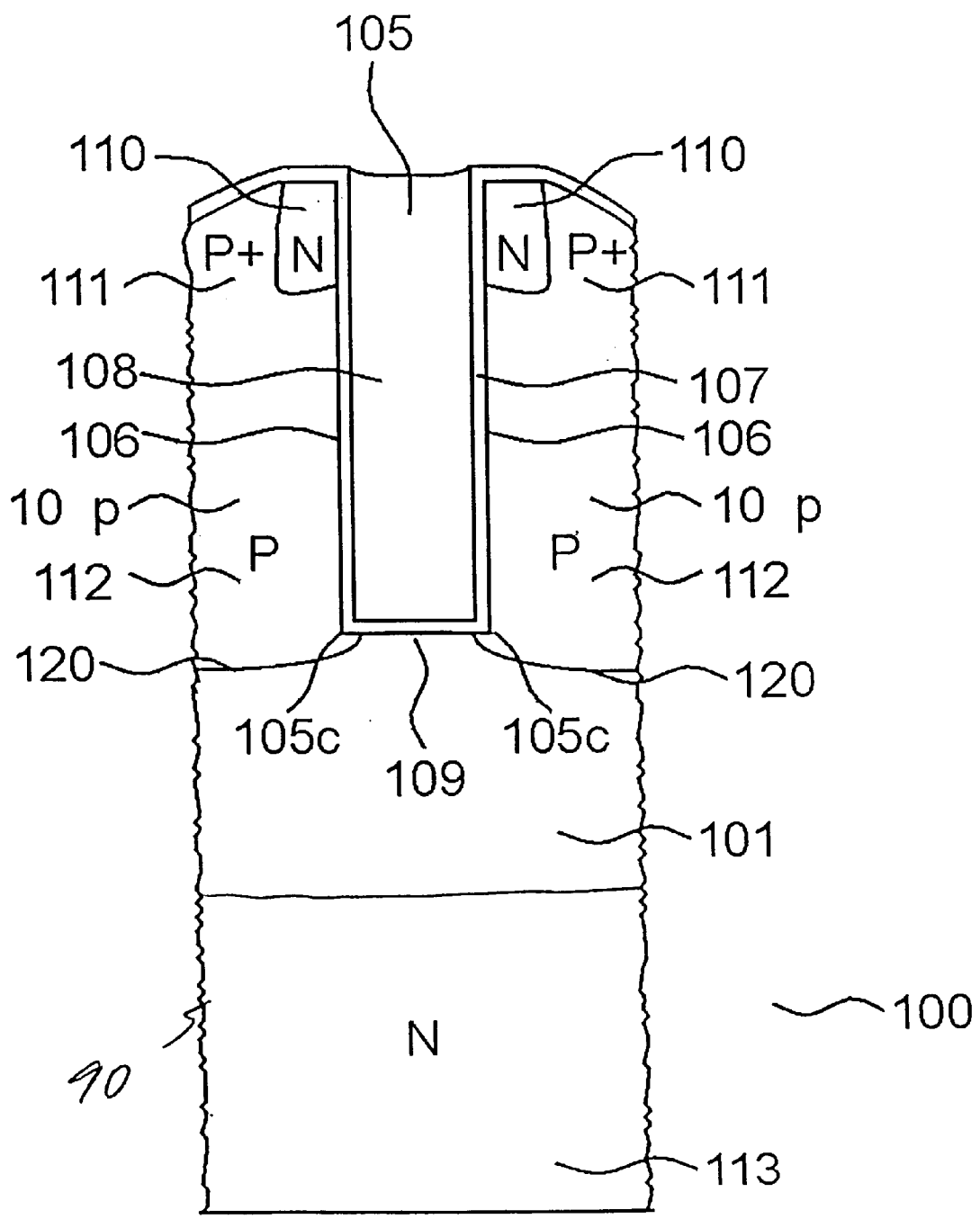
FIG. 7 shows the device after gate deposition and planarization.
Figure 8:
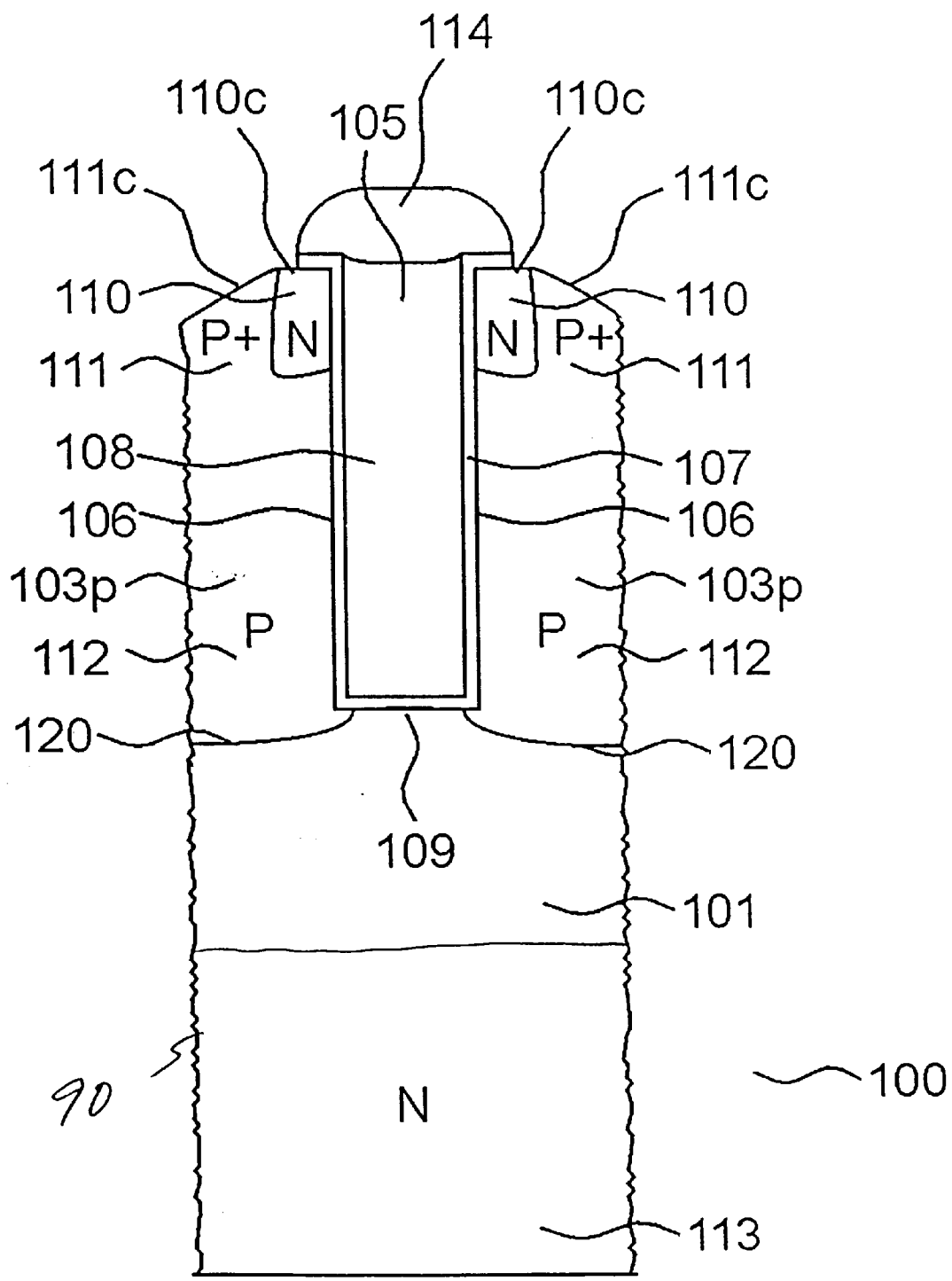
FIG. 8 shows the device after surface dielectric deposition and contact etch.
Figure 9:
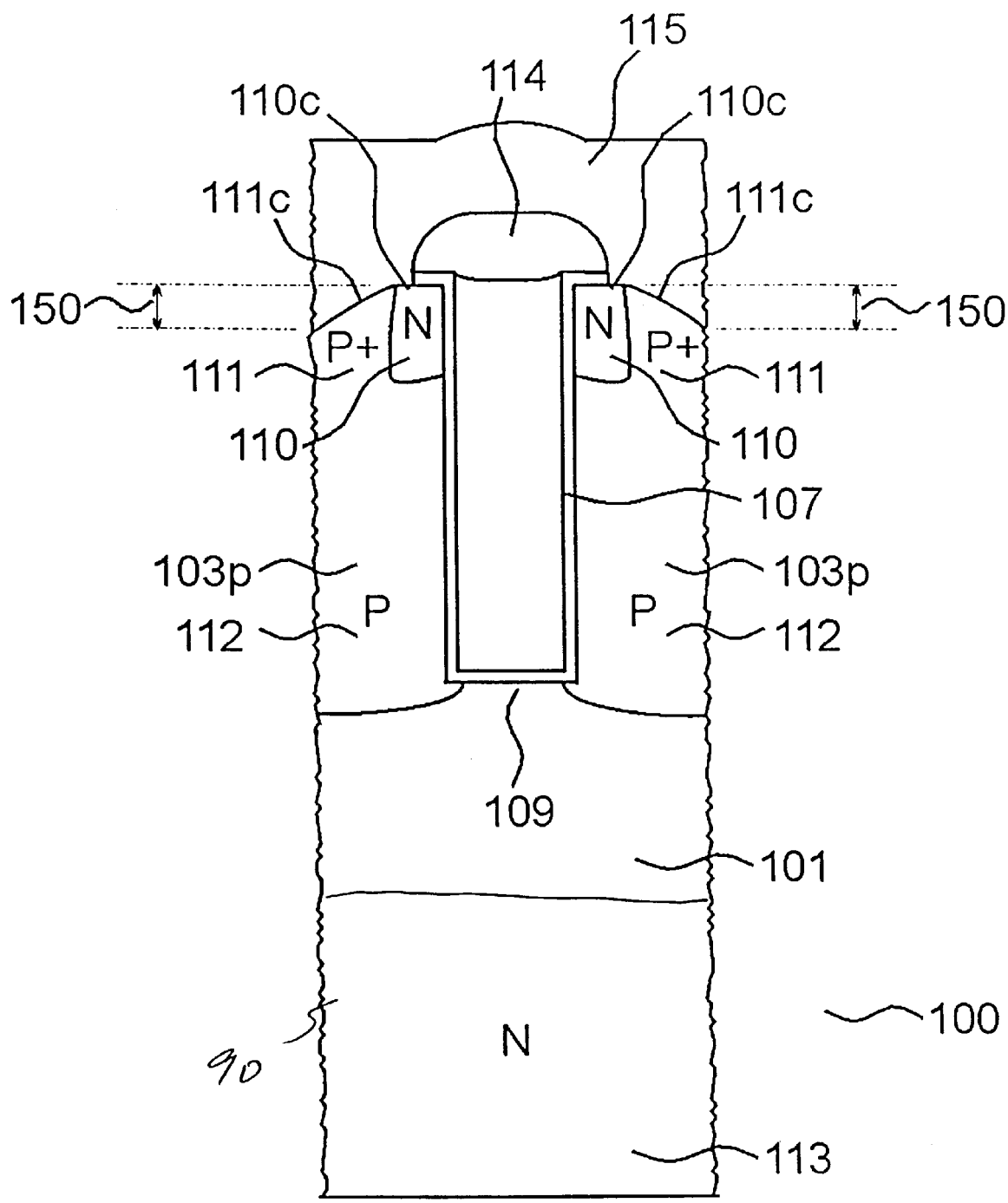
FIG. 9 shows the device after metal source/body contact deposition, with the degree of recess in the device body noted as in FIG. 5.

As shown in FIG. 6, a gate oxide 107 is then grown or deposited in gate trench 105. The oxidation process for gate trench 105 causes body region 103p (P-type epitaxial layer) to diffuse laterally and vertically around trench corners 105c, mitigating possible trench-corner-related reliability problems due to charge buildup. Refer now to FIG. 7. A trench gate material 108, typically doped polysilicon, is deposited and planarized to fill gate trench 105 to form trench gate 109. Refer to FIG. 8. An interlevel dielectric material 114 such as silicon dioxide is deposited on top of all of the diffusions 110, 111 and trench gate region 105, and a contact etch is performed which exposes all N+source contact area 110c and P+body planar contact area 111c without removing dielectric 107 from above gate 105. See FIG. 9.

The next steps in processing, as in prior-art devices, are to deposit metal 115 on the top surface which will serve as source/body contact for source region 110 and body region 111, and deposit metal (not shown) on the backside of the wafer which will serve as a contact for drain 113. The angle and consequent increased surface contact areas 110c and 111c of recess 150 have been substantially preserved throughout the described process.

Although the procedure outlines a specific process flow some variations of it are allowed and should not limit this disclosure. The specific angle of etch back of body planar contact area 111c may be varied. This will vary the degree of increase in the contact area, which may be traded off against other device design constraints. As described above, this structure is shown on N-channel silicon devices, but it could also be applied to other devices and other semiconductor materials and dopants. The physical plan layout alternatives of the present trench MOSFET device may among others include open-cell stripe and closed cell cellular topologies. The described device is Power MOSFET but the same innovation applies to all MOS gated devices like IGBT or MCT.

Conclusion, Ramifications, and Scope of Invention

From the above description, the proposed invention offers simplification and improvement of trench gate power semiconductor device fabrication in comparison to the prior art. The simplification, namely the use of the silicon spacer to form gate and body regions, allows more economical device fabrication. The improvement, namely the recessed body resulting from the use of the silicon spacer formation process, makes better use of lateral area on the device. The invention has been described in detail for the purpose of illustration, but it is understood that such detail is solely for that purpose, and variations can be made therein by those skilled in the art without departing from the spirit and scope of the invention, which is defined by the following claims.

What is claimed is:

1. A process for forming an improved trench-gated power device, said process comprising:
    forming on an upper epitaxial layer of a semiconductor substrate of a first conductivity type a dielectric layer having an upper surface and thickness and width dimensions that correspond substantially to the height and width dimensions of a gate trench;
    growing a first layer of epitaxial material of a second conductivity type over said substrate upper layer and said dielectric layer;
    planarizing said first layer of epitaxial material to be substantially below said, upper surface of said dielectric layer;
    growing a second layer of epitaxial spacer material of said first conductivity type over said first epitaxial layer and said dielectric layer to form a source region on opposite sides of the dielectric layer,
    growing a third layer of epitaxial material of said second conductivity type over said first epitaxial layer and second epitaxial layer to form a body region on opposite sides of the dielectric layer,
    planarizing said epitaxial material and the dielectric layer to form source regions and recessed body regions, wherein the third layer sloped so as to present an increased top contact surface area as compared to a flat horizontal top contact surface area,
    removing said dielectric layer, thereby forming gate trench sidewalls comprising selectively grown epitaxial material and selectively grown epitaxial spacer material,
    lining said gate trench with a dielectric material and substantially filling the resulting lined trench with a conductive material, thereby forming a trench gate.
2. The process of claim 1 further comprising:
    forming an interlevel dielectric layer overlying said trench gate and said source regions,
    forming a metal layer overlying said interlevel dielectric layer, said metal layer being in electrical contact with said source and body regions.
3. The process of claim 1 wherein said first conductivity type is N and second conductivity type is P.
4. The process of claim 1 wherein said first conductivity type is P and second conductivity type is N.
5. The process of claim 1 wherein said removing said dielectric layer is carried out using a wet etching procedure.
6. The process of claim 1 wherein said substrate and said layer of epitaxial material comprise silicon.
7. The process of claim 1 wherein said dielectric material comprises silicon dioxide.
8. The process of claim 1 wherein said conductive material in said gate trench comprises doped polysilicon.
9. The process of claim 1 further comprising forming a plurality of gate trenches.
10. The process of claim 9 wherein said plurality of gate trenches is formed using an open-ended stripe topology.
11. The process of claim 9 wherein said plurality of gate trenches is formed using a closed-cell cellular topology.
12. The process of claim 1 wherein said device is selected from the group consisting of a power MOSFET, an insulated gate bipolar transistor, and an MOS-controlled thyristor.

* * * * *